(12) United States Patent
Yang et al.

(10) Patent No.: US 10,573,553 B2
(45) Date of Patent: *Feb. 25, 2020

(54) SEMICONDUCTOR PRODUCT AND FABRICATION PROCESS

(71) Applicant: Texas Instruments Incorporated, Dallas, TX (US)

(72) Inventors: Hong Yang, Richardson, TX (US); Abbas Ali, Plano, TX (US); Yaping Chen, Chengdu (CN); Chao Zuo, Chengdu (CN); Seetharaman Sridhar, Richardson, TX (US); Yunlong Liu, Chengdu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/241,143

(22) Filed: Jan. 7, 2019

(65) Prior Publication Data

US 2019/0157142 A1    May 23, 2019

Related U.S. Application Data

(63) Continuation of application No. 15/928,492, filed on Mar. 22, 2018, now Pat. No. 10,211,096, which is a
(Continued)

(51) Int. Cl.
*H01L 21/00* (2006.01)
*H01L 21/768* (2006.01)
(Continued)

(52) U.S. Cl.
CPC .. *H01L 21/76847* (2013.01); *H01L 21/28556* (2013.01); *H01L 21/32136* (2013.01); *H01L 23/53223* (2013.01)

(58) Field of Classification Search
CPC ......... H01L 21/31144; H01L 21/31116; H01L 23/53238; H01L 21/76802;
(Continued)

(56) References Cited

U.S. PATENT DOCUMENTS 7,442,647 B1    10/2008  Kanakasabapathy et al.
2002/0056837 A1*  5/2002  Yamanaka .......... G02F 1/13454
                                                257/57
(Continued)

FOREIGN PATENT DOCUMENTS

CN        101286473 A    10/2008
CN        101355048 A     1/2009
(Continued)

OTHER PUBLICATIONS

Patent Cooperation Treaty Search Report, dated Aug. 20, 2018, International Application No. PCT/CN2017/112240.

*Primary Examiner* — S. V. Clark
(74) *Attorney, Agent, or Firm* — Jacqueline J. Garner; Charles A. Brill; Frank D. Cimino

(57) ABSTRACT

Disclosed examples provide processes for fabricating a semiconductor product and for forming a patterned stack with an aluminum layer and a tungsten layer, including forming a first dielectric layer on a gate structure and on first and second regions of a substrate, forming a diffusion barrier layer on the first dielectric layer, forming a tungsten layer on the diffusion barrier layer, forming an aluminum layer on the tungsten layer, forming a hard mask on the aluminum layer, forming a patterned resist mask which covers the hard mask above the first region and exposes the hard mask layer above the second region, dry etching the hard mask and the aluminum layer above the second region using the patterned resist mask layer, removing the resist mask, and dry etching
(Continued)

the tungsten layer using the hard mask layer to expose the first dielectric layer above the second region.

20 Claims, 7 Drawing Sheets

Related U.S. Application Data continuation of application No. PCT/CN2017/112240, filed on Nov. 22, 2017.

(51) Int. Cl.
*H01L 21/285* (2006.01)
*H01L 21/3213* (2006.01)
*H01L 23/532* (2006.01)

(58) Field of Classification Search
CPC ........... H01L 21/76897; H01L 2224/11; H01L 2224/32145; H01L 2924/01074; H01L 23/485; H01L 21/76832; H01L 2224/45124; H01L 2924/01013

USPC ........ 438/622, 623, 627; 257/750, 751, 758, 257/764, 765

See application file for complete search history.

(56) References Cited

U.S. PATENT DOCUMENTS

| 2006/0267116 A1* | 11/2006 | Shimamoto ....... H01L 21/28202 257/411 |
| 2016/0155714 A1* | 6/2016 | Hilsenbeck ............. H01L 24/05 257/762 |
| 2016/0181184 A1* | 6/2016 | Matsumoto ............. H01L 24/05 257/751 |

FOREIGN PATENT DOCUMENTS

| CN | 101399220 A | 4/2009 |
| CN | 107170678 A | 9/2017 |
| CN | 107221495 A | 9/2017 |

* cited by examiner

SEMICONDUCTOR PRODUCT AND FABRICATION PROCESS

CROSS REFERENCE TO RELATED APPLICATIONS

This application is a continuation of U.S. Nonprovisional patent application Ser. No. 15/928,492, filed Mar. 22, 2018, the contents of which is herein incorporated by reference in its entirety.

TECHNICAL FIELD

The present disclosure is directed to semiconductor devices, and more particularly to fabrication techniques for producing semiconductor products.

BACKGROUND

Metallization structures are used to conduct current and provide electrical connection to transistor terminals and other semiconductor devices in discrete semiconductor products and integrated circuits. Thick aluminum metal interconnection structures formed over pre-metal dielectrics can accommodate high current levels for power switching applications and the like. However, aluminum is a soft metal, and vertical pressure on the aluminum formed above transistor gate structures during manufacturing or packaging can damage the gate structure.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later. The present disclosure provides semiconductor products as well as processes or methods to fabricate a semiconductor product and to form a patterned stack with an aluminum layer and an underlying tungsten layer. Disclosed implementations can be used to provide the high current carrying capability of thick aluminum metallization interconnection structures in combination with good critical dimension process control and a protective tungsten structure above transistor gate structures in an integrated circuit or a discrete semiconductor device product to mitigate or avoid gate structure damage by vertical pressure.

Disclosed examples include a semiconductor product fabrication process which includes forming a first dielectric layer on a gate structure and on first and second regions of a substrate, forming a diffusion barrier layer on the first dielectric layer, and forming a tungsten layer on the diffusion barrier layer. The method further includes forming an aluminum layer on the tungsten layer, forming a hard mask on the aluminum layer, forming a patterned resist mask which covers the hard mask above the first region and exposes the hard mask layer above the second region. The method further includes dry etching the hard mask and the aluminum layer above the second region using the patterned resist mask layer, removing the resist mask, and dry etching the tungsten layer and the diffusion barrier layer using the hard mask layer to expose the first dielectric layer above the second region of the substrate.

A process is disclosed for forming a patterned stack including an aluminum layer and an underlying tungsten layer, including forming a tungsten layer, forming an aluminum layer on the tungsten layer, forming a hard mask layer on the aluminum layer, forming a patterned resist mask layer which covers a first portion of the hard mask layer and which exposes a second portion of the hard mask layer, performing a first dry etch process which removes the exposed second portion of the hard mask layer and which exposes an underlying portion of the aluminum layer, and performing a second dry etch process which removes the exposed portion of the aluminum layer and which exposes an underlying portion of the tungsten layer above the second region. The method further includes removing the resist mask layer to expose the hard mask layer, and performing a third dry etch process which removes the exposed portion of the tungsten layer together with the underlying diffusion barrier layer.

Further aspects of the present disclosure provide a semiconductor product, including a semiconductor substrate, including a lateral first region and a lateral second region, a gate structure on or in the first region of the substrate, a contact structure on or in the first region of the substrate, a first dielectric layer on the gate structure and on the first and second regions of the substrate, and a diffusion barrier layer on the first dielectric layer above the first region of the substrate. The semiconductor product further includes a tungsten layer on the diffusion barrier layer above the first region of the substrate, an aluminum layer on the tungsten layer above the first region of the substrate, a hard mask layer on the aluminum layer above the first region of the substrate, and a second dielectric layer which covers the hard mask layer above the first region of the substrate and which covers the first dielectric layer above the second region of the substrate.

DETAILED DESCRIPTION

Figure 1:
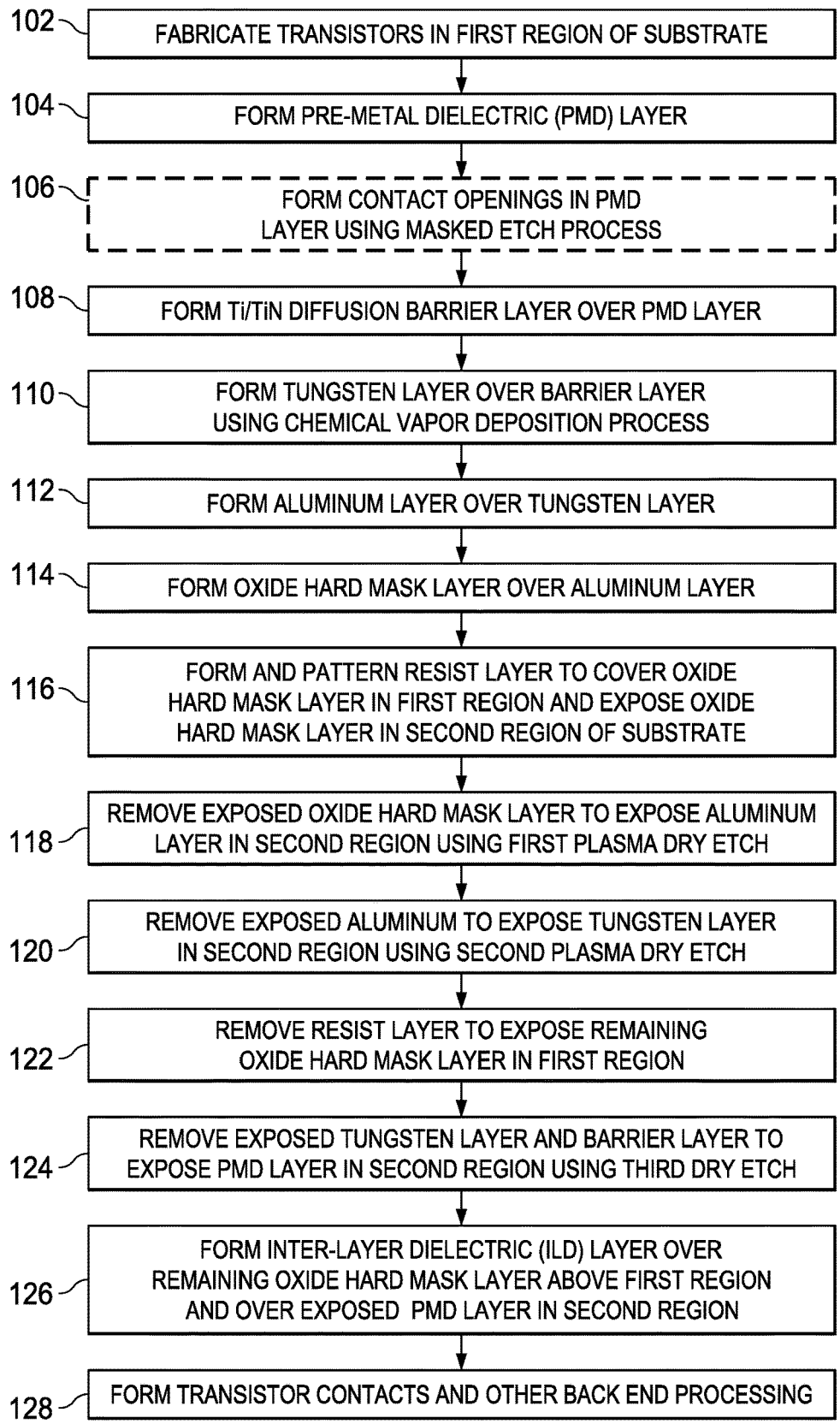
FIG. 1 shows an example process for fabricating a semiconductor product, including forming a patterned stack including an aluminum layer and an underlying tungsten layer.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to". Several examples are described below with reference to example applications for illustration. Various specific details, relationships, and methods are set forth to provide an understanding of the disclosed concepts. Disclosed concepts can be practiced without one or more of the specific details or with other methods. The disclosed concepts are not limited by the illustrated ordering of acts or events, as some acts may occur in different orders and/or concurrently with other acts or events. Furthermore, not all illustrated acts or events are required to implement a process or method in accordance with the disclosed concepts.

Figure 2:
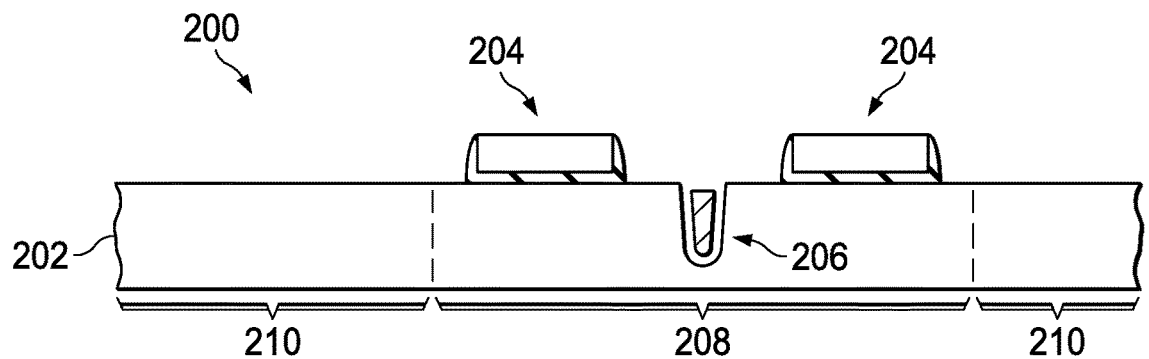
FIGS. 2-13 are cross sectional side elevation views of a semiconductor product shown at successive stages of fabrication.

FIG. 1 illustrates a process or method 100 to fabricate a semiconductor product. The process 100 can be used for producing a discrete semiconductor product including a single transistor or other semiconductor device with interconnections to the device terminals as well as for producing integrated circuits including multiple transistors or other semiconductor devices. FIGS. 2-13 illustrate fabrication of an example semiconductor product generally according to the process 100. The process 100 includes fabricating transistors in a first region of a substrate. Any suitable semiconductor substrate can be used, including without limitation silicon wafers, silicon-on-insulator (SOI) wafers, substrates including other semiconductor materials such as gallium arsenide, gallium nitride, etc. FIG. 2 shows an example semiconductor product 200 during fabrication according to the process 100 of FIG. 1. The semiconductor product 200 of FIG. 2 includes a silicon substrate 202.

Figure 14:
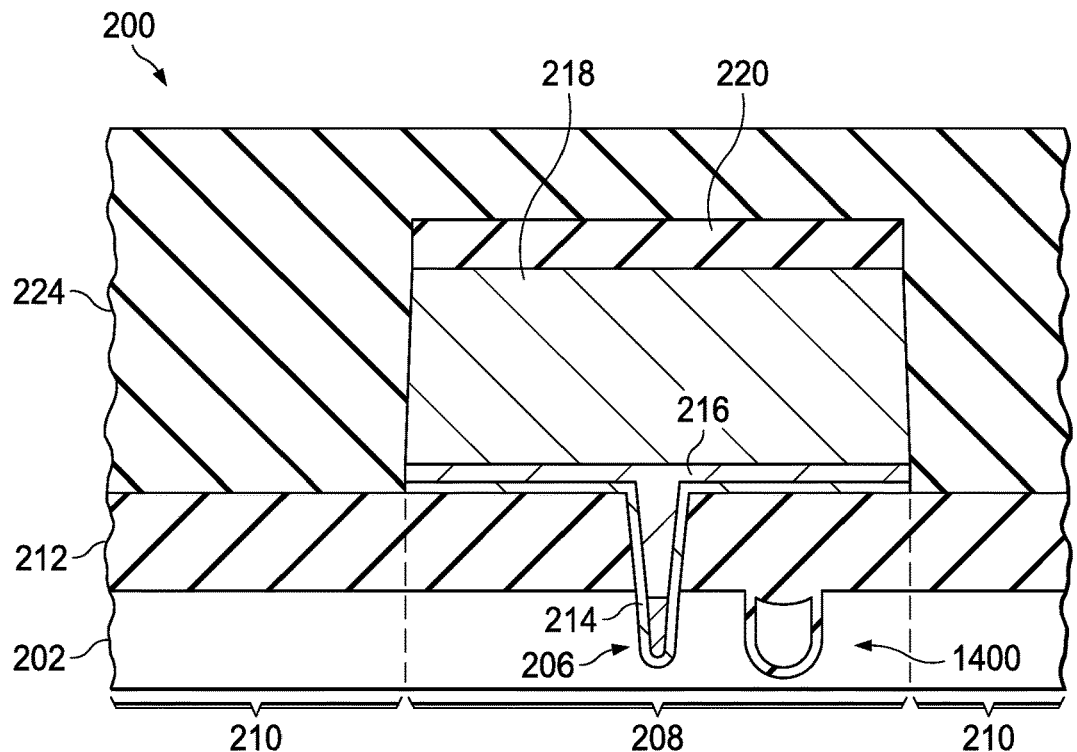
FIG. 14 is a cross sectional side elevation view of another example semiconductor product.

The process 100 of FIG. 1 includes fabricating a gate structure at 102 on or in a first region of the substrate. In FIG. 2, first and second gate structures 204 are formed on an upper surface of the substrate 202 using any suitable gate fabrication techniques and processes (not shown). In other examples, a trench gate construction can be used, in which a gate structure is fabricated in the substrate 202, as seen in FIG. 14 below. The semiconductor product 200 of FIG. 2 further includes a contact structure 206 formed in a recess of the substrate 202. The gate structures 204 and the contact structure 206 in FIG. 2 are formed on or in a first lateral first region of the substrate 202. The substrate 202 further includes one or more lateral second regions 210 as shown in the example of FIG. 2. For a single device semiconductor product, two or more regions 208 can be defined and processed as described below, for example, one each for a transistor gate contact, a drain contact and a source contact, and many contacts can be provided in multi-device IC product example. The drawings show only a single first region 208 and corresponding contact structure 206 to demonstrate various concepts of the disclosed processes and products.

Figure 3:
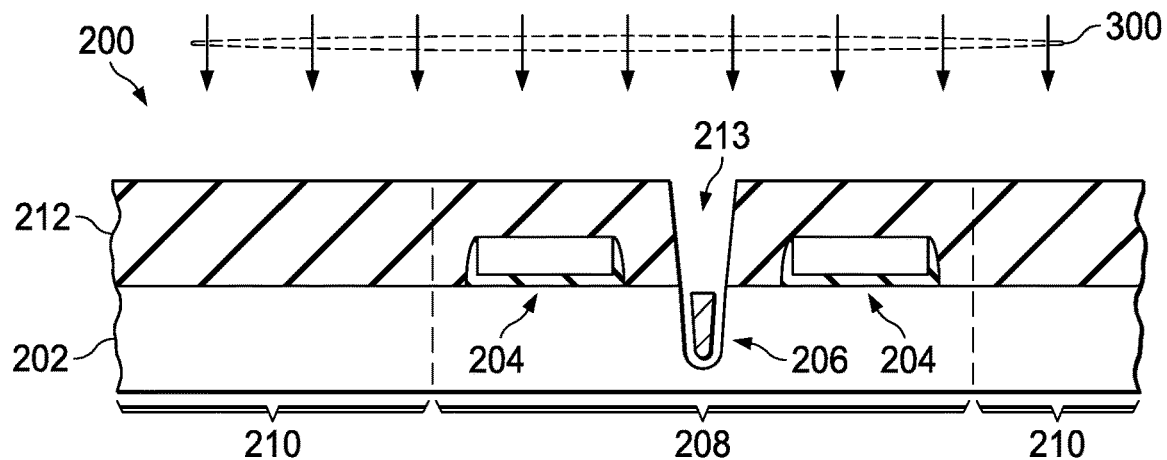

The process 100 also includes forming a first dielectric layer at 104. The initial dielectric layer formed over the semiconductor material and any gate structures or contacts is referred to herein as a pre-metal dielectric (PMD) layer, and operates to provide electrical isolation. FIG. 3 illustrates one example of the PMD layer fabrication, where a first deposition process 300 is performed. The deposition process 300 forms a first dielectric layer 212 on the gate structure 204 and on the first and second regions 208 and 210 of the substrate 202. Any suitable dielectric material and processing steps can be used to form the PMD layer 212, such as undoped silicate glass (USG), Tetraethyl orthosilicate or tetraethoxysilane (($C_2H_5O)_4Si$ or $C_8H_{20}O_4Si$, referred to as TEOS), silicon nitride ($SiH_4$) materials formed using a plasma enhanced chemical vapor deposition (PE-CVD) process 300. In other examples, a high density plasma (HDP CVD) process 300 is used to form a silicon dioxide ($SiO_2$) PMD layer 212. The PMD fabrication at 104 in FIG. 1 can also optionally include removing some of the deposited layer material 212, for example, using chemical mechanical polishing (CMP, not shown) to provide a smooth upper surface of the PMD layer 212. At 106 in FIG. 1, one or more contact openings can be formed in the PMD layer, for example, using a masked etch process (not shown). FIG. 3 illustrates an example where a contact opening 213 is formed in the PMD layer 212 in order to expose the previously formed contact structure 206.

Figure 4:
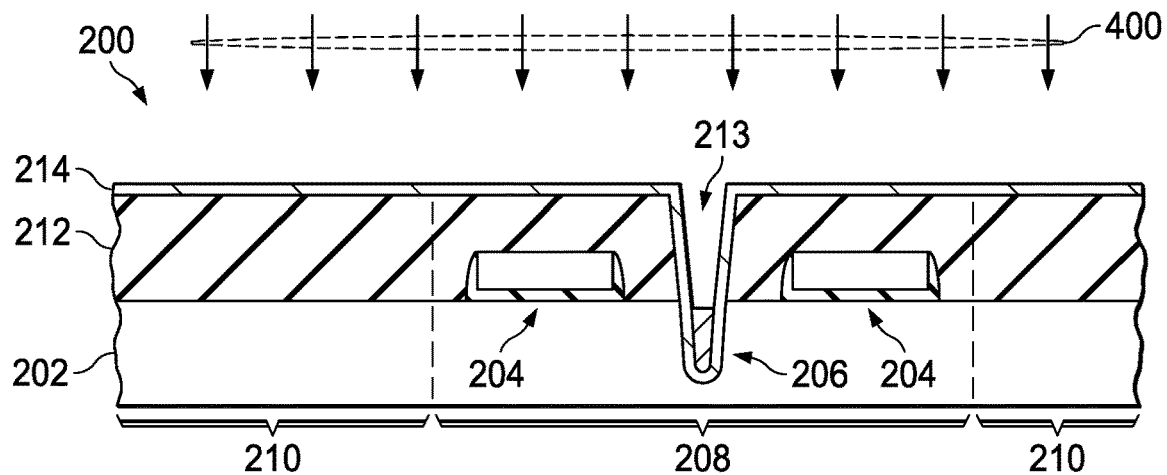

The process 100 continues at 108 in FIG. 1, including forming a diffusion barrier layer on the first dielectric layer. The diffusion barrier layer inhibits diffusion of impurities between metal and silicon. FIG. 4 illustrates performance of a second deposition process 400 which forms a diffusion barrier layer 214 on the first dielectric layer 212. Any suitable diffusion barrier material or materials can be used to form the layer 214. In certain examples, the diffusion barrier layer 214 can be a multilayer structure including two or more material layers. In one example, a titanium/titanium nitride (Ti/TiN) diffusion barrier 214 is formed on the dielectric layer 212 using sputtering or other suitable deposition process 400. As further shown in the example of FIG. 4, the diffusion barrier layer 214 extends along sidewalls and into the contact opening 213 to form an electrical connection to the contact structure 206.

Figure 5:
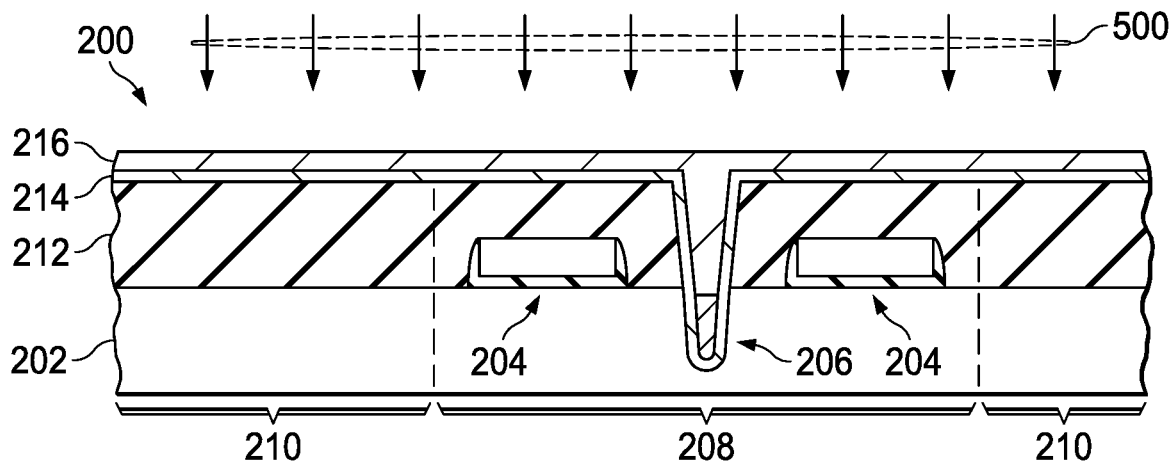
Figure 6:
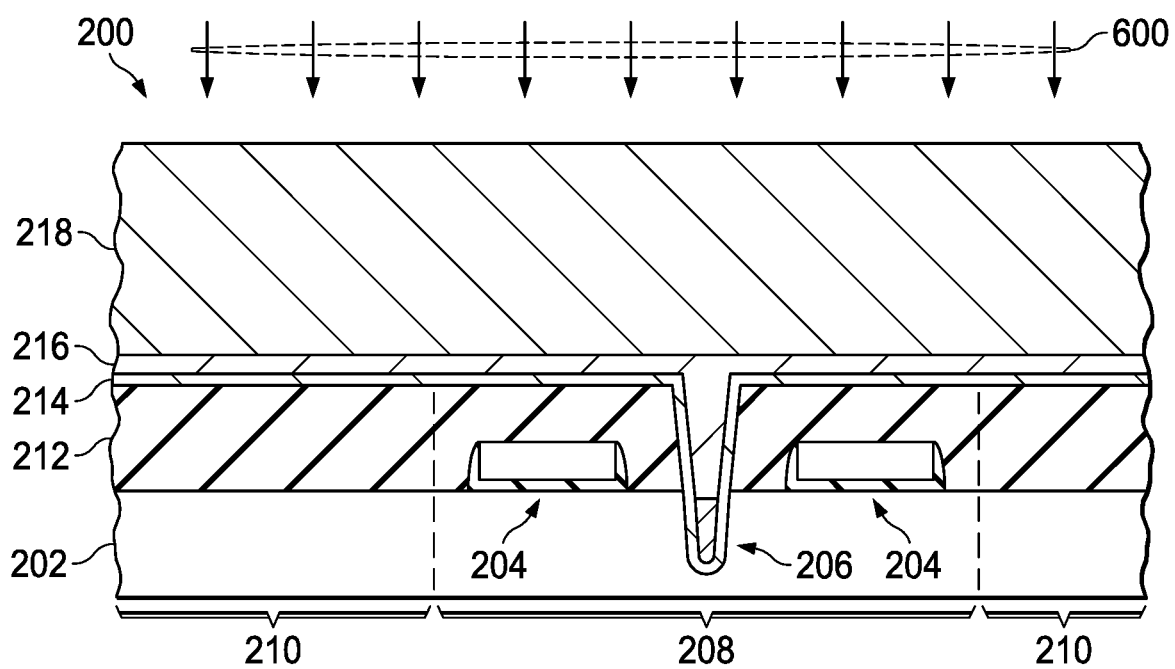

At 110 in FIG. 1, a tungsten layer (W) is formed over the diffusion barrier layer using a third deposition process. FIG. 5 shows one example, in which a chemical vapor deposition (CVD) process 500 is performed. The process 500 forms a tungsten layer 216 on the diffusion barrier layer 214. The tungsten layer 216 in FIG. 5 fills the PMD layer opening 213, and contacts the diffusion barrier layer 214 along the sidewalls of the contact opening through the PMD layer 212. In practice, the deposited tungsten layer 216 can be used throughout the product 200 to provide low impedance electrical connection to structures and features formed on or in the substrate 202. In addition, portions of the tungsten layer 216 advantageously provides structural protection for underlying gate structures (e.g., 204) in the finished semiconductor product 200 to mitigate or avoid gate structure damage due to vertical pressure or forces during subsequent fabrication processing. In one non-limiting example, tungsten layer 216 is deposited to a thickness of approximately 3000 Å, although any suitable tungsten layer thickness can be provided in different implementations. In one example, the process 100 includes refraining from removing any of the tungsten layer 216 before performing 112 the fourth deposition process 600 to form the aluminum layer 218 on the tungsten layer 216. This is unlike other processes where a deposited tungsten layer is polished using chemical mechanical polishing (CMP) prior to aluminum deposition. In this regard, the process 100 advantageously saves processing time and cost associated with tungsten CMP processing.

At 112 in FIG. 1, an aluminum layer is formed over the tungsten layer. FIG. 5 shows an example where a fourth deposition process 600 is performed. The process 600 forms an aluminum layer 218 on the tungsten layer 216. Any suitable aluminum deposition process 600 can be used to form an aluminum layer 218 to any desired thickness. In the illustrated example, the deposited aluminum layer 218 is very thick, for example, approximately 3 μm, to facilitate fabrication of a transistor device capable of switching relatively large currents.

Figure 7:
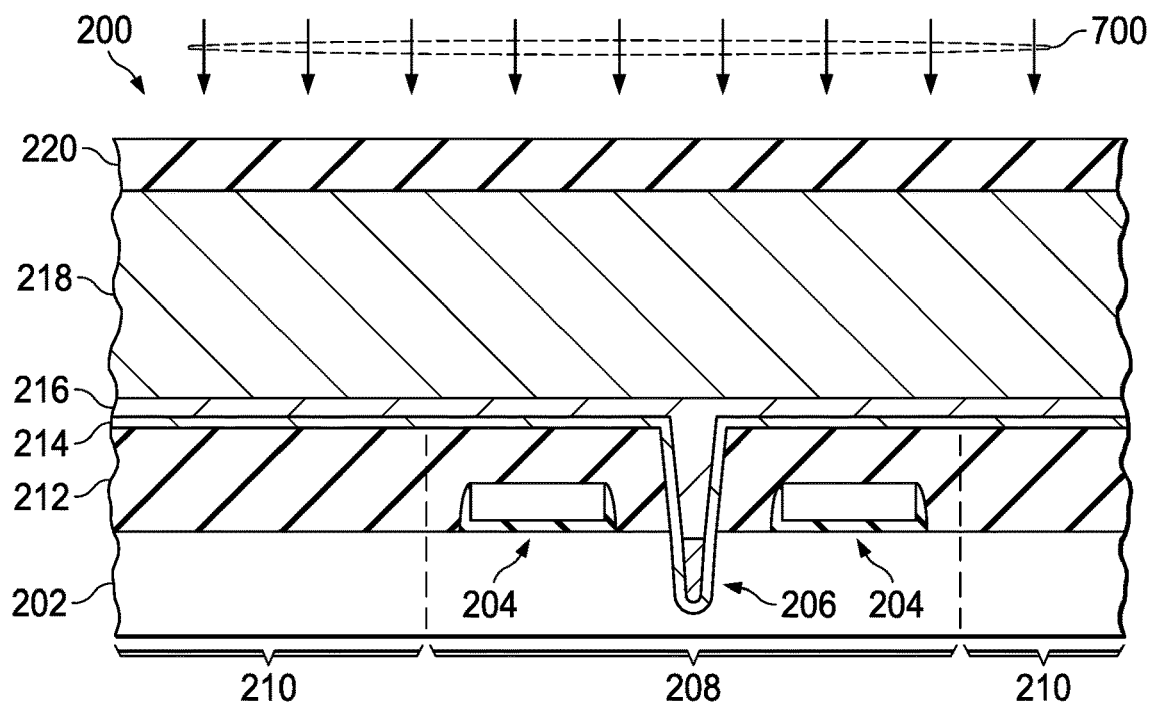

At 114 in FIG. 1, a hard mask layer is formed over the aluminum layer. Any suitable hard mask material and deposition process can be used at 114. FIG. 7 illustrates an example where a fifth deposition process 700 is performed to deposit an oxide hard mask layer 220 on the aluminum layer 218.

Figure 8:
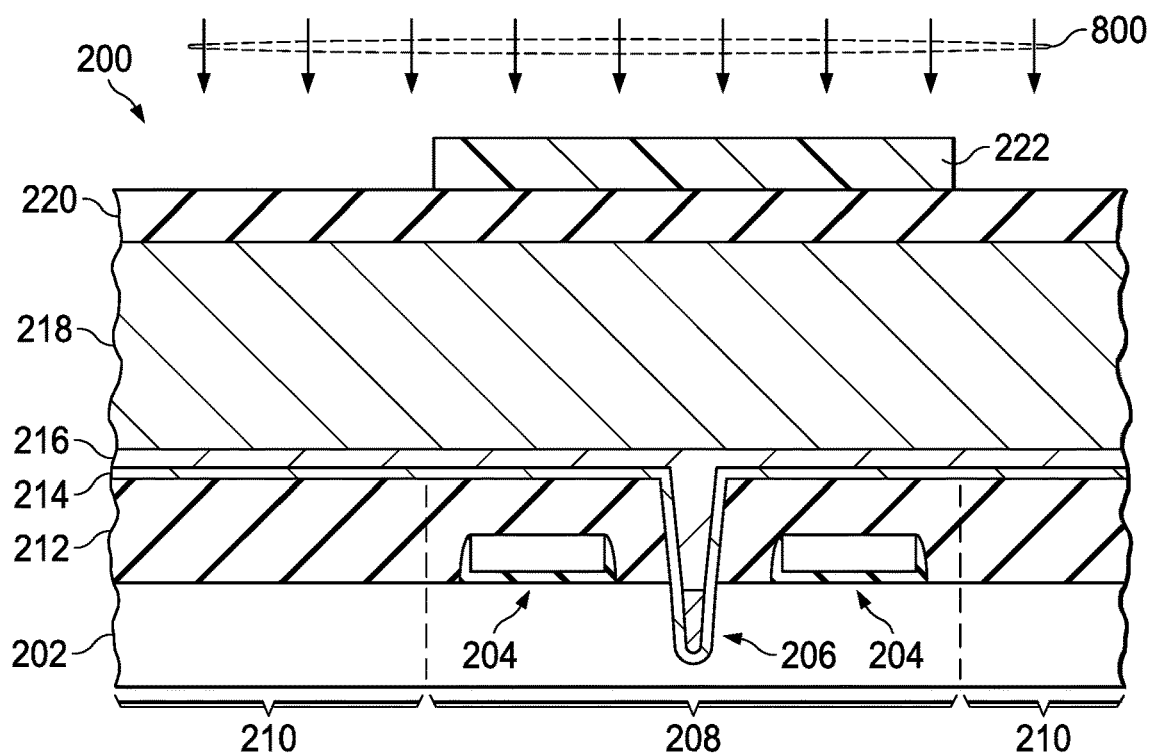

At 116 in FIG. 1, a resist mask material layer is deposited and patterned to cover the hard mask layer above the first region while exposing the hard mask layer above the second region. In the example of FIG. 8, a lithography process 800 is performed to deposit and pattern a resist mask layer 222 over a portion of the hard mask layer 220. The patterned resist mask layer 222 covers the hard mask layer 220 above the first region 208 and exposes the hard mask layer 220 above the second region 210 of the substrate 202.

Figure 9:
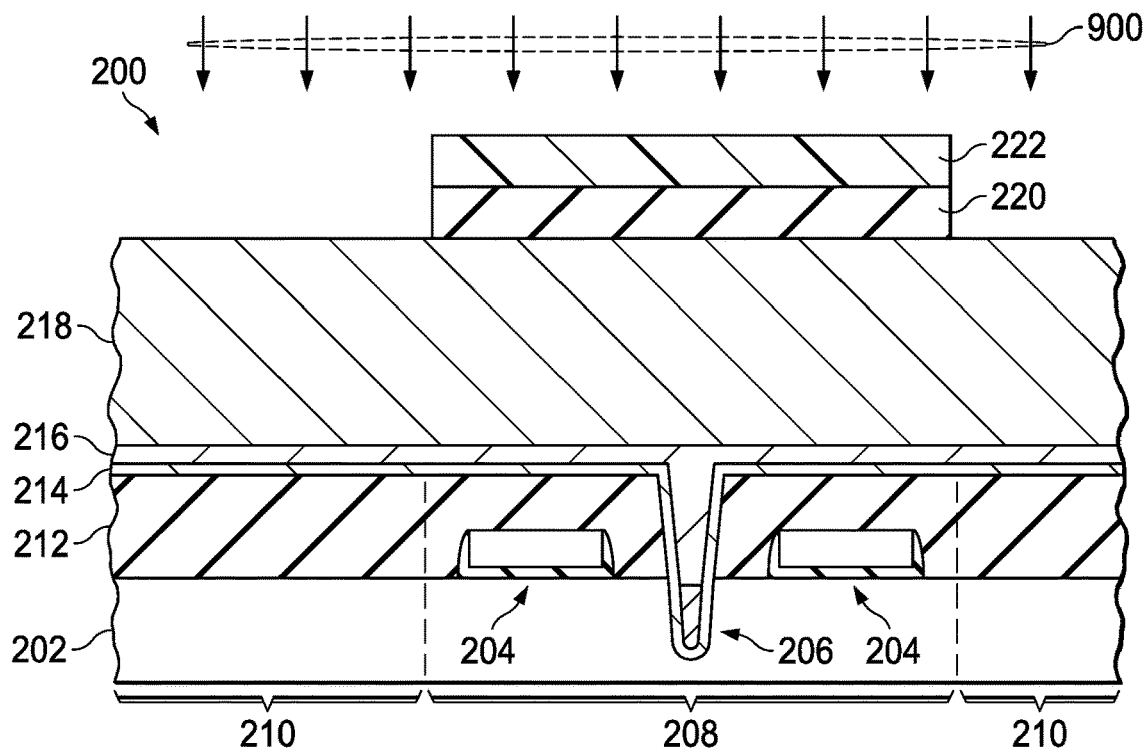
Figure 10:
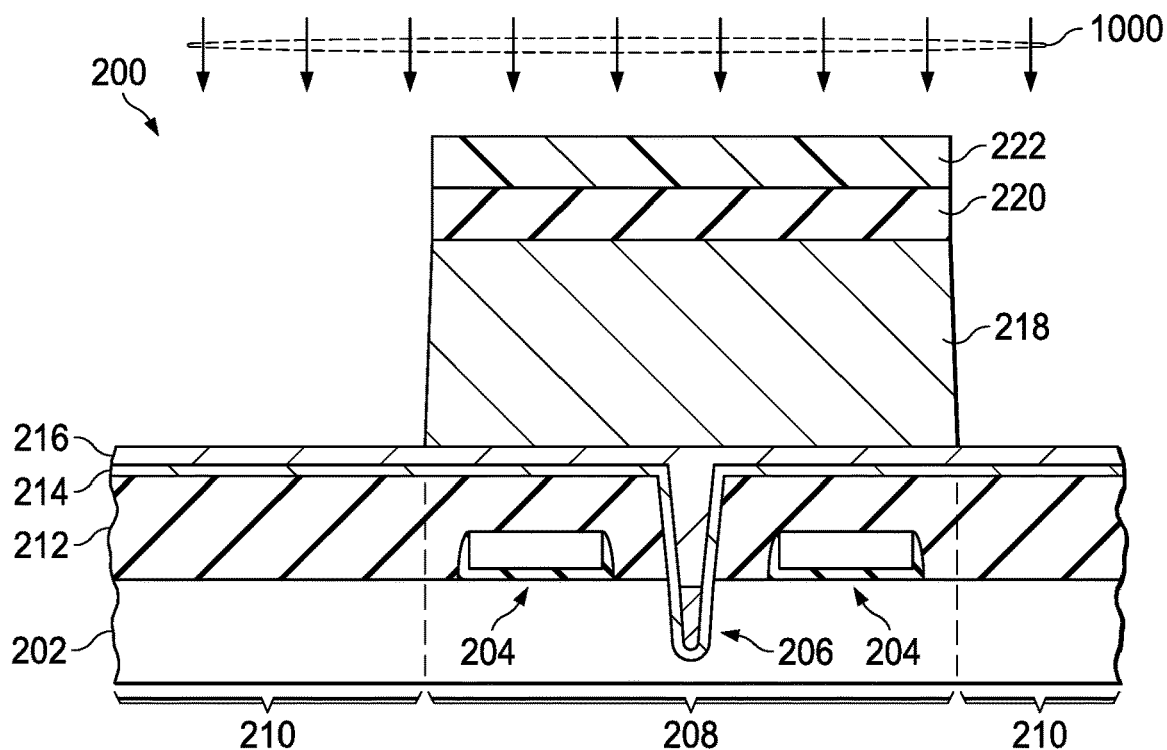
Figure 11:
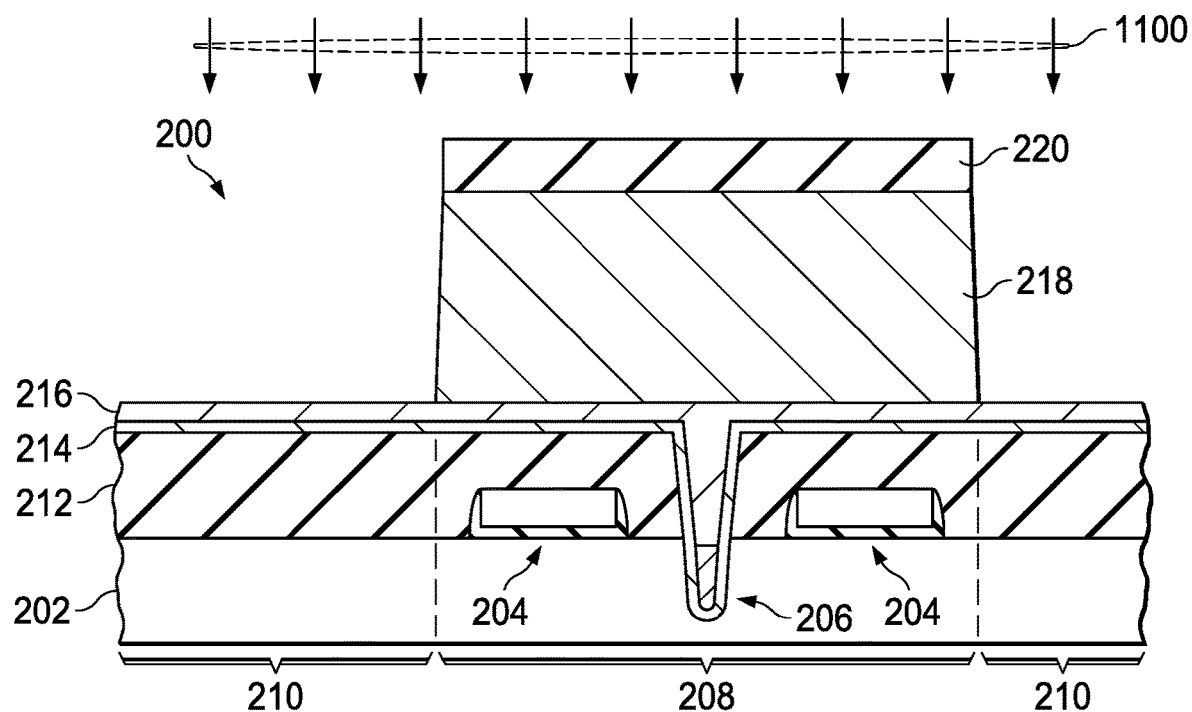

Referring also to FIGS. 9 and 10, the process 100 of FIG. 1 further includes dry etching the hard mask layer and the aluminum layer above the second region using the patterned resist mask layer to expose the tungsten layer above the second region. At 118 in FIG. 1, the exposed portion of the hard mask above the second region is removed by dry etching. FIG. 9 shows an example where a first dry etch process 900 is performed. The first dry etch process 900 removes exposed portions of the hard mask layer 220 and exposes the underlying aluminum layer 218 above the second region 210. In one example, the first dry etch process 900 is a plasma etch process using Ar, CF4 etch chemistry.

At 120 in FIG. 1, the exposed aluminum above the second region is removed to expose the tungsten layer using a second dry etch process. In the example of FIG. 10, a second dry etch process 1000 is performed which removes exposed portions of the aluminum layer 218 and exposes the tungsten layer 216 above the second region 210. In one example, the second dry etch process 1000 is a plasma etch process using a BCl3, Cl2, SF6 etch chemistry.

Figure 12:
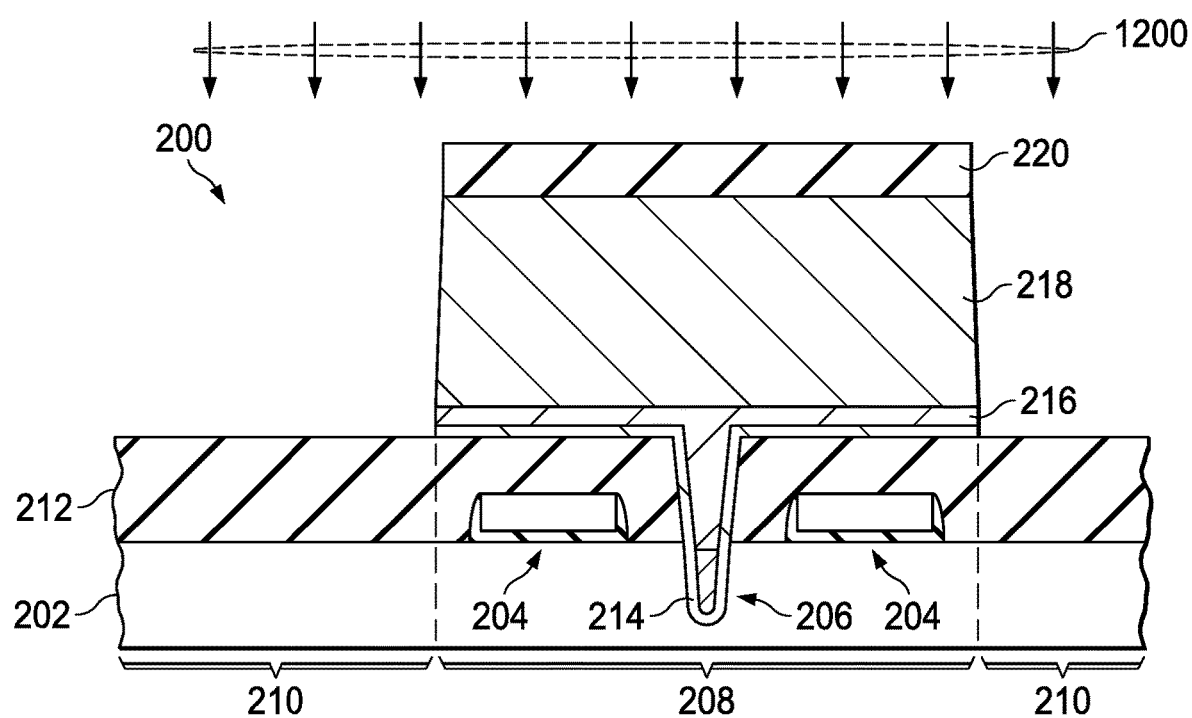

The process 100 in FIG. 1 further includes removing the resist mask layer at 122 and etching the tungsten and barrier layers using the hard mask layer as a dry etch mask at 124. A resist strip process 1100 is performed in FIG. 11 which removes the resist mask layer and exposes the hard mask layer 220 above the first region 208. In FIG. 12, a third dry etch process 1200 is performed which removes exposed portions of the tungsten layer 216 and the underlying diffusion barrier layer 214 and exposes the first dielectric layer 212 above the second region 210. In one example, the third etch process 1200 is a plasma etch process using a N2, SF6 etch chemistry to remove the unmasked portion of the tungsten layer 216 using the hard mask layer 220 as an etch mask. The etch chemistry of the process 1200 in one example is changed to BCl3, Cl2 to remove the remaining exposed TiTiN barrier layer 214 and expose the second portion 210 of the substrate 202.

Compared with wet etching of aluminum, the example process 100 with plasma dry etching provides highly anisotropic etch properties, and thus facilitates improved control of critical lateral feature dimensions. Moreover, unlike other processes that use tungsten only for contact formation, the process 100 advantageously eliminates tungsten CMP processing before aluminum deposition. This is unlike other processes where a deposited tungsten layer is polished to remove tungsten except in contact trenches or openings, the process 100 saves processing time and cost. Moreover, the resulting semiconductor product 200 includes a protective tungsten structure above the gate structures 204 for protection against mechanical stresses and vertical force during subsequent fabrication and/or packaging processing.

The illustrated process example 100 further includes forming a second dielectric layer at 126, referred to herein as an inter-layer dielectric (ILD) layer over the remaining oxide hard mask layer above the first region and over the exposed PMD layer (or any remaining barrier layer material) in the second region of the substrate. Transistor contacts and interconnections can be fabricated in the first ILD layer and further back end processing is performed at 128 to complete the semiconductor product 200. A single ILD layer may be sufficient for a discrete semiconductor device product 200. Further metallization layers (not shown) can be constructed thereafter as needed for a given semiconductor product application (e.g., IC products, etc.).

Figure 13:
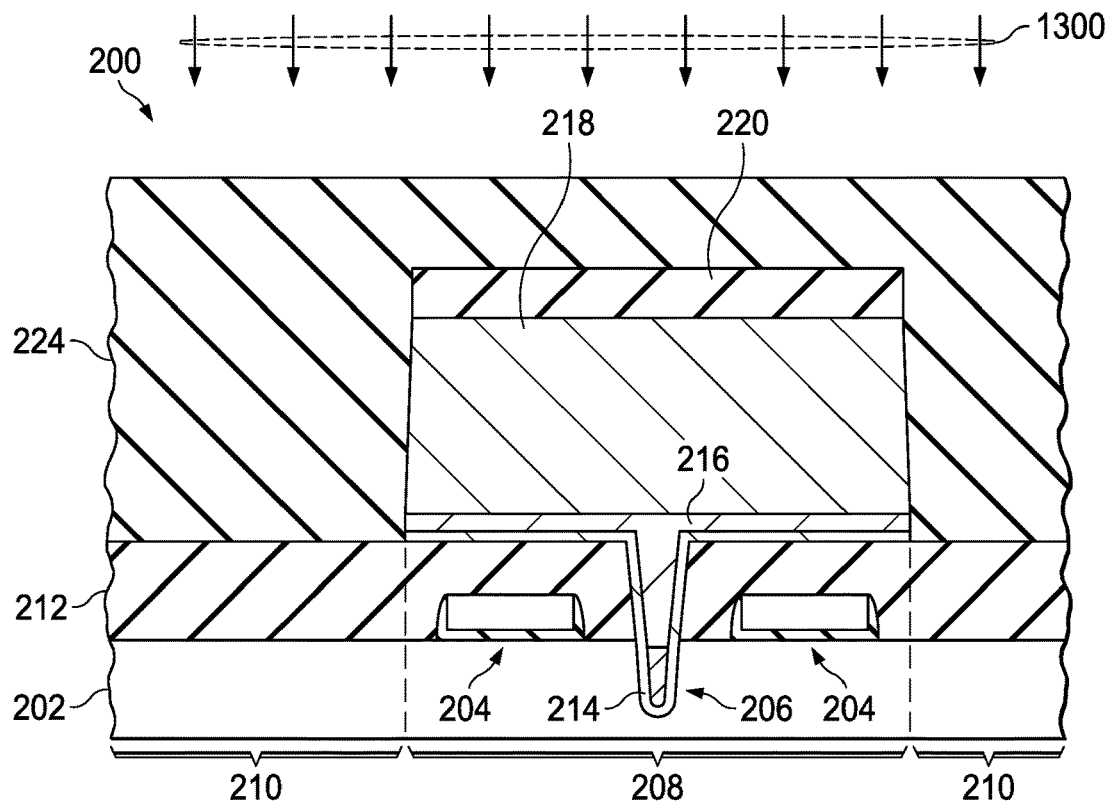

FIG. 13 shows an example where a fifth deposition process 1300 is performed which forms a second dielectric layer (ILD) 224 on the remaining hard mask layer 220 above the first region 208 and on the first dielectric layer 212 above the second region 210 of the substrate 202. Any suitable process 1300 can be used to deposit a suitable dielectric material 224, such as oxide material. In this example, the patterned hard mask material 220 remains above the aluminum/tungsten stack, where the ILD oxide 224 and the hard mask structure 220 provide sufficient isolation to facilitate operation in a metallization/contact configuration with one or more ILD layers and associated conductive interconnection structures (not shown). Moreover, the remaining tungsten provides a protective shield for the gate structures 204. This represents an advantage compared with other process where tungsten is only present in the contact trench above the contact structure 206, since aluminum is a much softer material than tungsten and aluminum does not provide the same level of mechanical protection that the example tungsten structure 216 above the gate structures 204.

FIG. 14 shows another example implementation of a semiconductor product 200 as generally described above. In this example, however, a trench gate configuration is used with gate structure 1400 formed in a trench in the substrate 202. In the example devices 200 of FIGS. 13 and 14, the gate is electrically contacted by one or more gate contact structures (not shown) formed at ends of the illustrated gate structures 204, 1400 (e.g., into or out of the page in FIGS. 13 and 14). The disclosed examples this provide the structural protection of the tungsten 216 to protect the gate structures, along with the critical dimension (CD) control advantages of dry etching in patterning the aluminum and tungsten metal stack (e.g., process and line width control), with the process/cost benefits of refraining from an tungsten CMP processing.

The example processing at 110-124 in FIG. 1 can be used in other applications requiring precise CD control is desired for forming a patterned stack with an aluminum layer and an underlying tungsten layer (e.g., layers 216 and 218 in FIGS. 13 and 14). This provides a process or method that includes performing (110) a chemical vapor deposition process (e.g., 500 in FIG. 5) which forms a tungsten layer 216, performing (112) a deposition process (e.g., 600 in FIG. 6) which forms an aluminum layer 218 on the tungsten layer 216, performing (114) a deposition process (e.g., 700 in FIG. 7) which forms a hard mask layer 220 on the aluminum layer 218, and forming (116) a patterned resist mask layer 222 which covers a first portion of the hard mask layer 220 and which exposes a second portion of the hard mask layer 220 (e.g., FIG. 8 above). The etch process further includes performing (118) a first dry etch process (e.g., 900 in FIG. 9 above) which removes the exposed second portion of the hard mask layer 220 and which exposes an underlying portion of the aluminum layer 218, and performing 120 a second dry etch process (e.g., 1000 in FIG. 10) which removes the exposed portion of the aluminum layer 218 and which exposes an underlying portion of the tungsten layer 216 above the second region 210. The resist mask 222 can then be stripped or otherwise removed and a third etch process is performed (e.g., at 124 in FIG. 1, process 1200 in FIG. 12) which removes the exposed portion of the tungsten layer 216.

The above examples are merely illustrative of several possible implementations of various aspects of the present disclosure, wherein equivalent alterations and/or modifications will occur to others skilled in the art upon reading and The following is claimed:

1. A process of fabricating a semiconductor device, the process comprising:
   forming a gate structure on a first region of a semiconductor substrate;
   depositing a first dielectric layer on the gate structure and on the first region and a second region of the semiconductor substrate;
   depositing a diffusion barrier layer on the first dielectric layer;
   forming a tungsten layer on the diffusion barrier layer;
   forming an aluminum layer on the tungsten layer;
   forming a hard mask layer on the aluminum layer;
   dry etching the hard mask layer and the aluminum layer above the second region to expose the tungsten layer above the second region; and
   dry etching the tungsten layer and the diffusion barrier layer using the hard mask layer to expose the first dielectric layer above the second region.

2. The process of claim 1, further comprising forming a second dielectric layer on the remaining hard mask layer above the first region and on the exposed first dielectric layer above the second region.

3. The process of claim 1, wherein dry etching the hard mask layer and the aluminum layer comprises:
   removing exposed portions of the hard mask layer and which exposes the aluminum layer above the second region using a first dry etch process; and
   removing exposed portions of the aluminum layer and which exposes the tungsten layer above the second region using a second dry etch process.

4. The process of claim 3, wherein dry etching the tungsten layer comprises performing a third dry etch process which removes exposed portions of the tungsten layer and the diffusion barrier layer, and which exposes the first dielectric layer above the second region.

5. The process of claim 4, wherein the third dry etch process is a plasma etch process.

6. The process of claim 3, wherein the first and second dry etch processes are plasma etch processes.

7. The process of claim 1, wherein the hard mask layer and the aluminum layer are etched using at least one plasma etch process.

8. The process of claim 1, wherein dry etching the tungsten layer comprises performing a plasma etch process which removes the exposed portions of the tungsten layer and the diffusion barrier layer, and which exposes the first dielectric layer above the second region.

9. The process of claim 1, wherein the gate structure is fabricated on the first region of the substrate.

10. The process of claim 1, wherein the gate structure is fabricated in the first region of the substrate.

11. The process of claim 1, comprising refraining from removing any of the tungsten layer before performing the fourth deposition process to form the aluminum layer on the tungsten layer.

12. A process of an integrated circuit (IC), comprising:
   forming a tungsten layer using a chemical vapor deposition process;
   forming an aluminum layer on the tungsten layer;
   forming a hard mask layer on the aluminum layer;
   forming a patterned resist mask layer which covers a first portion of the hard mask layer and which exposes a second portion of the hard mask layer;
   using the patterned resist mask layer, performing a first dry etch process which removes the second portion of the hard mask layer and which exposes an underlying portion of the aluminum layer;
   using the patterned resist mask layer, performing a second dry etch process which removes the underlying portion of the aluminum layer and which exposes an underlying portion of the tungsten layer;
   removing the resist mask layer; and
   using the hard mask layer, performing a third dry etch process which removes the underlying portion of the tungsten layer.

13. The process of claim 12, wherein the first and second dry etch processes are plasma etch processes.

14. The process of claim 13, wherein the third dry etch process is a plasma etch process.

15. The process of claim 12, wherein the third dry etch process is a plasma etch process.

16. The process of claim 12, comprising refraining from removing any of the tungsten layer before forming the aluminum layer on the tungsten layer.

17. A semiconductor device, comprising:
   a semiconductor substrate, including a lateral first region and a lateral second region;
   a gate structure on or in the first region of the substrate;
   a contact structure on or in the first region of the substrate;
   a first dielectric layer on the gate structure and on the first and second regions of the substrate;
   a diffusion barrier layer on the first dielectric layer above the first region of the substrate;
   a tungsten layer on the diffusion barrier layer above the first region of the substrate;
   a aluminum layer on the tungsten layer above the first region of the substrate;
   a hard mask layer on the aluminum layer above the first region of the substrate; and
   a second dielectric layer which covers the hard mask layer above the first region of the substrate and which covers the first dielectric layer above the second region of the substrate.

18. The semiconductor device of claim 17, wherein the aluminum layer is approximately 3 μm thick.

19. The semiconductor device of claim 17, wherein the gate structure is in the first region of the substrate.

20. The semiconductor device of claim 17, wherein the tungsten layer extends through the first dielectric layer to the contact structure on or in the first region of the substrate.

* * * * *